United States Patent
Ioannou et al.

(10) Patent No.: US 11,048,571 B2
(45) Date of Patent: Jun. 29, 2021

(54) SELECTIVELY PERFORMING MULTI-PLANE READ OPERATIONS IN NON-VOLATILE MEMORY

(71) Applicant: International Business Machines Corporation, Armonk, NY (US)

(72) Inventors: Nikolas Ioannou, Zurich (CH); Nikolaos Papandreou, Thalwil (CH); Roman A. Pletka, Uster (CH); Sasa Tomic, Kilchberg (CH); Charalampos Pozidis, Thalwil (CH); Aaron D. Fry, Richmond, TX (US); Timothy J. Fisher, Cypress, TX (US); Kevin E. Sallese, Plainfield, IL (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 16/218,159

(22) Filed: Dec. 12, 2018

(65) Prior Publication Data
US 2020/0192735 A1  Jun. 18, 2020

(51) Int. Cl.
*G06F 11/07* (2006.01)
*G06F 3/06* (2006.01)
(Continued)

(52) U.S. Cl.
CPC .......... *G06F 11/076* (2013.01); *G06F 3/064* (2013.01); *G06F 3/0619* (2013.01);
(Continued)

(58) Field of Classification Search
CPC .... G06F 11/076; G06F 3/064; G06F 12/0246; G06F 3/0688; G06F 3/0619; G11C 29/021; G11C 11/5642
See application file for complete search history.

(56) References Cited

U.S. PATENT DOCUMENTS

| 8,347,042 B2 | 1/2013 | You |
| 9,251,909 B1 | 2/2016 | Camp et al. |

(Continued)

FOREIGN PATENT DOCUMENTS

JP    2017107620 A  *  6/2017

OTHER PUBLICATIONS

Sakaki, Performance analysis of three-dimensional-triple-level cell and two dimensional-multi-level cell NAND flash hybrid solid-state drives, (Feb. 26, 2018), Japanese Journal of Applied Physics #57 (Year: 2018).*

(Continued)

*Primary Examiner* — April Y Blair
*Assistant Examiner* — Matthew W Wahlin
(74) *Attorney, Agent, or Firm* — Zilka-Kotab, P.C.

(57) ABSTRACT

A computer-implemented method, according to one embodiment, includes: receiving a multi-page read request and predicting whether using a multi-plane read operation to read pages of storage space in memory which correspond to the multi-page read request will result in a bit error rate that is in a predetermined range. In response to predicting that using the multi-plane read operation to read the pages will not result in a bit error rate that is in the predetermined range, a threshold voltage shift (TVS) value is computed for the multi-plane read operation. Furthermore, the pages are read using the multi-plane read operation with the computed TVS. Other systems, methods, and computer program products are described in additional embodiments.

15 Claims, 10 Drawing Sheets

(51) Int. Cl.
   *G11C 11/56* (2006.01)
   *G06F 12/02* (2006.01)
   *G11C 29/02* (2006.01)

(52) U.S. Cl.
   CPC ........ *G06F 3/0688* (2013.01); *G06F 12/0246* (2013.01); *G11C 11/5642* (2013.01); *G11C 29/021* (2013.01)

(56) References Cited

U.S. PATENT DOCUMENTS

| | | | |
|---|---|---|---|
| 9,367,392 B2 | 6/2016 | Michael | |
| 9,431,121 B2* | 8/2016 | Muchherla | G11C 16/26 |
| 9,524,773 B2 | 12/2016 | Lee | |
| 9,558,816 B2 | 1/2017 | Han et al. | |
| 9,761,308 B1* | 9/2017 | Cometti | G11C 29/52 |
| 9,792,995 B1* | 10/2017 | Shah | G11C 16/26 |
| 9,934,865 B2 | 4/2018 | Griffin et al. | |
| 9,971,647 B2 | 5/2018 | Michael | |
| 2006/0218359 A1* | 9/2006 | Sanders | G06F 12/0246 |
| | | | 711/154 |
| 2011/0164453 A1 | 7/2011 | Lee | |
| 2013/0173847 A1* | 7/2013 | Sprouse | G11C 7/1012 |
| | | | 711/103 |
| 2014/0281814 A1* | 9/2014 | Vogan | G06F 11/1004 |
| | | | 714/766 |
| 2014/0310574 A1 | 10/2014 | Yu et al. | |
| 2017/0062045 A1 | 3/2017 | Wilson | |
| 2017/0271022 A1 | 9/2017 | Watanabe et al. | |
| 2017/0309340 A1 | 10/2017 | Shah et al. | |
| 2017/0371565 A1 | 12/2017 | Liu et al. | |

OTHER PUBLICATIONS

Gao, "Exploiting Parallelism for Access Conflict Minimization in Flash-Based SSDs", Jan. 2018, IEEE Transactions on Computer-Aided Design of Integrated Circuits and Systems, vol. 37, No. 1 (Year: 2018).*

Luo et al., "Multi-page read for NAND flash," IEEE, 2017, 5 pages.

Cai et al., "Threshold Voltage Distribution in MLC NAND Flash Memory: Characterization, Analysis, and Modeling," EDAA, 2013, pp. 1-6.

Woo et al., "FMMU: A Hardware-Automated Flash Map Management Unit for Scalable Performance of NAND Flash-Based SSDs," arXiv preprint, 2017, 12 pages, retrieved from https://arxiv.org/abs/1704.03168.

Cai et al., "Errors in Flash-Memory-Based Solid-State Drives: Analysis, Mitigation, and Recovery," arXiv preprint, 2018, 86 pages, retrieved from https://arxiv.org/abs/1711.11427.

U.S. Appl. No. 16/109,689, filed Aug. 22, 2018.

* cited by examiner

SELECTIVELY PERFORMING MULTI-PLANE READ OPERATIONS IN NON-VOLATILE MEMORY

BACKGROUND

The present invention relates to data storage systems, and more particularly, this invention relates to performing multi-page read operations in non-volatile memory.

Using Flash memory as an example, the performance characteristics of conventional NAND Flash-based solid state drives (SSDs) are fundamentally different from those of traditional hard disk drives (HDDs). Data in conventional SSDs is typically organized in pages of 4, 8, or 16 KB sizes. Moreover, page read operations in SSDs are typically one order of magnitude faster than write operations and latency neither depends on the current nor the previous location of operations.

The raw bit error rate (RBER) of a Flash memory block will typically increase over time due to additional program and erase cycling, charge leakage from retention, and additional charge placed in the cells by read operations (i.e., read disturb errors). Typically, a Flash memory block is retired when any page in the block exhibits a code word that reaches a page retirement error count limit. This limit is typically set to be achieved in conjunction with an appropriate error correction code (ECC), resulting in the Uncorrectable Bit Error Rate (UBER) after applying the ECC for a Flash memory block being set to be similar to the UBER in traditional hard disk drives, e.g., at around $10^{-15}$, but may be more or less.

Read voltage shifting, also known as block calibration, has been shown to be a key contributor to enhance endurance and retention, particularly for enterprise-level Flash memory systems using modern three-dimensional (3-D) triple-level-cell (TLC) or quad-level-cell (QLC) NAND Flash memory. Attempts to maintain efficient memory performance include inspecting the read voltages for each block of memory in a sweeping fashion or by a read voltage shifting algorithm that tracks and corrects the read voltages depending on how the threshold voltage distributions have changed as a result of cycling or retention or other disturbing effects.

SUMMARY

A computer-implemented method, according to one embodiment, includes: receiving a multi-page read request and predicting whether using a multi-plane read operation to read pages of storage space in memory which correspond to the multi-page read request will result in a bit error rate that is in a predetermined range. In response to predicting that using the multi-plane read operation to read the pages will not result in a bit error rate that is in the predetermined range, a threshold voltage shift (TVS) value is computed for the multi-plane read operation. Furthermore, the pages are read using the multi-plane read operation with the computed TVS.

A computer program product, according to another embodiment, includes a computer readable storage medium having program instructions embodied therewith. The program instructions readable and/or executable by a processor to cause the processor to: perform the foregoing method.

A system, according to yet another embodiment, includes: a processor; and logic integrated with and/or executable by the processor, the logic being configured to: perform the foregoing method.

Other aspects and embodiments of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of data storage systems, as well as operation and/or component parts thereof. It should be appreciated that various embodiments herein can be implemented with a wide range of memory mediums, including for example non-volatile random access memory (NVRAM) technologies such as NAND Flash memory, NOR Flash memory, phase-change memory (PCM), magnetoresistive RAM (MRAM) and resistive RAM (RRAM). To provide a context, and solely to assist the reader, various embodiments may be described with reference to a type of non-volatile memory. This has been done by way of example only, and should not be deemed limiting on the invention defined in the claims.

In one general embodiment, a computer-implemented method includes: receiving a multi-page read request and predicting whether using a multi-plane read operation to read pages of storage space in memory which correspond to the multi-page read request will result in a bit error rate that is in a predetermined range. In response to predicting that using the multi-plane read operation to read the pages will not result in a bit error rate that is in the predetermined range, a threshold voltage shift (TVS) value is computed for the multi-plane read operation. Furthermore, the pages are read using the multi-plane read operation with the computed TVS.

In another general embodiment, a computer program product includes a computer readable storage medium having program instructions embodied therewith. The program instructions readable and/or executable by a processor to cause the processor to: perform the foregoing method.

In yet another general embodiment, a system includes: a processor; and logic integrated with and/or executable by the processor, the logic being configured to: perform the foregoing method.

Figure 1:
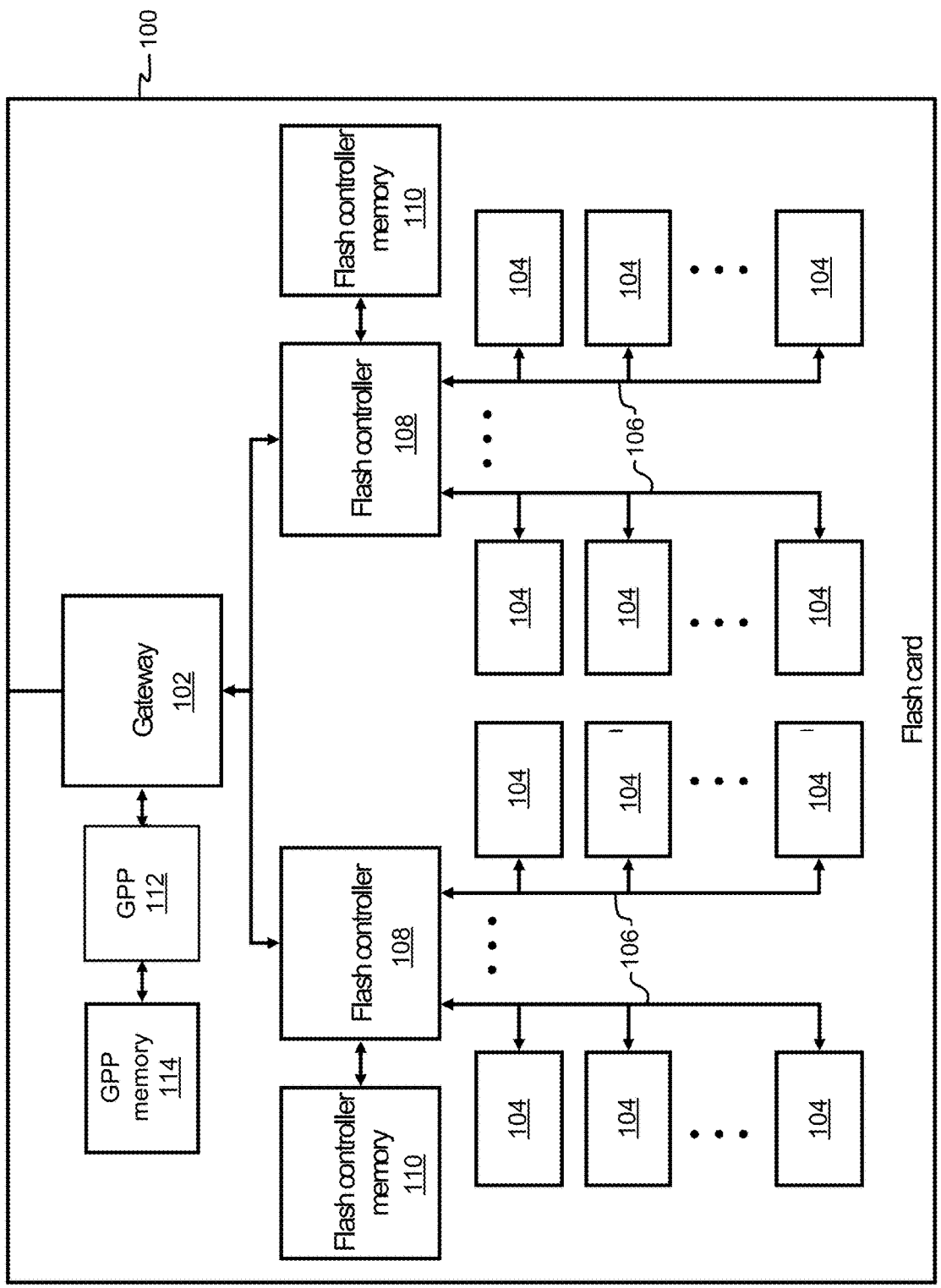
FIG. 1 is a diagram of a non-volatile memory card, in accordance with one embodiment.

FIG. 1 illustrates a memory card 100, in accordance with one embodiment. It should be noted that although memory card 100 is depicted as an exemplary non-volatile data storage card in the present embodiment, various other types of non-volatile data storage cards may be used in a data storage system according to alternate embodiments. It follows that the architecture and/or components of memory card 100 are in no way intended to limit the invention, but rather have been presented as a non-limiting example.

Moreover, as an option, the present memory card 100 may be implemented in conjunction with features from any other embodiment listed herein, such as those described with reference to the other FIGS. However, such memory card 100 and others presented herein may be used in various applications and/or in permutations which may or may not be specifically described in the illustrative embodiments listed herein. Further, the memory card 100 presented herein may be used in any desired environment.

With continued reference to FIG. 1, memory card 100 includes a gateway 102, a general purpose processor (GPP) 112 (such as an ASIC, FPGA, CPU, etc.) connected to a GPP memory 114 (which may comprise RAM, ROM, battery-backed DRAM, phase-change memory PC-RAM, MRAM, STT-MRAM, etc., or a combination thereof), and a number of memory controllers 108, which include Flash controllers in the present example. Each memory controller 108 is connected to a plurality of NVRAM memory modules 104 (which may comprise NAND Flash or other non-volatile memory type(s) such as those listed above) via channels 106.

According to various embodiments, one or more of the controllers 108 may be or include one or more processors, and/or any logic for controlling any subsystem of the memory card 100. For example, the controllers 108 typically control the functions of NVRAM memory modules 104 such as, data writing, data recirculation, data reading, etc. The controllers 108 may operate using logic known in the art, as well as any logic disclosed herein, and thus may be considered as a processor for any of the descriptions of non-volatile memory included herein, in various embodiments.

Moreover, the controller 108 may be configured and/or programmable to perform or control some or all of the methodology presented herein. Thus, the controller 108 may be considered to be configured to perform various operations by way of logic programmed into one or more chips, modules, and/or blocks; software, firmware, and/or other instructions being available to one or more processors; etc., and combinations thereof.

Referring still to FIG. 1, each memory controller 108 is also connected to a controller memory 110 which preferably includes a cache which replicates a non-volatile memory structure according to the various embodiments described herein. However, depending on the desired embodiment, the controller memory 110 may be battery-backed DRAM, phase-change memory PC-RAM, MRAM, STT-MRAM, etc., or a combination thereof.

Figure 2:
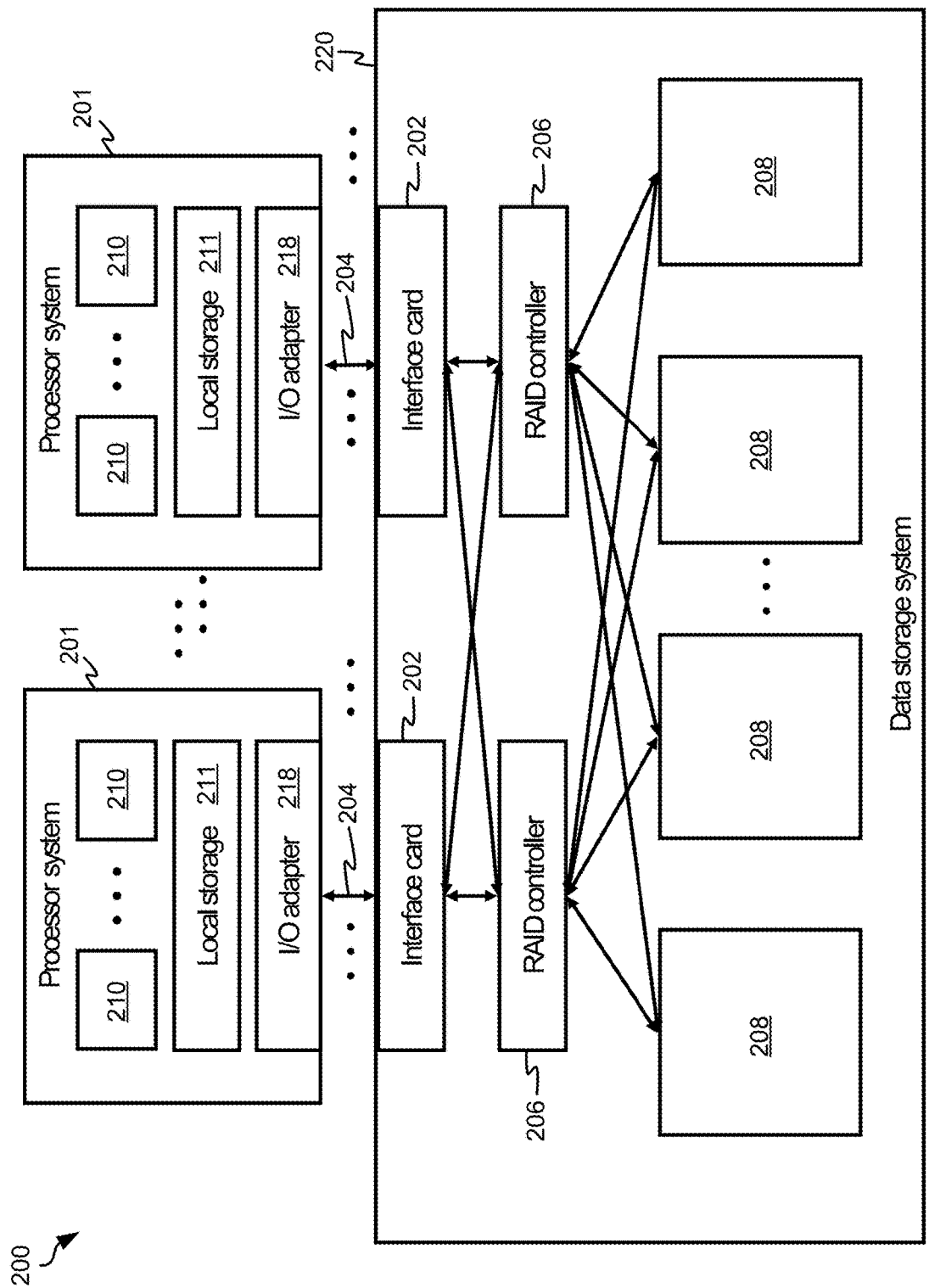
FIG. 2 is a diagram of a data storage system architecture, in accordance with one embodiment.

As previously mentioned, memory card 100 may be implemented in various types of data storage systems, depending on the desired embodiment. FIG. 2 illustrates a data storage system architecture 200 according to an exemplary embodiment which is in no way intended to limit the invention. Moreover, it should be noted that the data storage system 220 of FIG. 2 may include various components found in the embodiment of FIG. 1.

Looking to FIG. 2, the data storage system 220 comprises a number of interface cards 202 configured to communicate via I/O interconnections 204 to one or more processor systems 201. The data storage system 220 may also comprise one or more Redundant Array of Independent Disks (RAID) controllers 206 configured to control data storage in a plurality of non-volatile data storage cards 208. The non-volatile data storage cards 208 may comprise NVRAM, Flash memory cards, RAM, ROM, and/or some other known type of non-volatile memory.

The I/O interconnections 204 may include any known communication protocols, such as Fiber Channel (FC), FC over Ethernet (FCoE), Infiniband, Internet Small Computer System Interface (iSCSI), Transport Control Protocol/Internet Protocol (TCP/IP), Peripheral Component Interconnect Express (PCIe), etc., and/or any combination thereof.

The RAID controller(s) 206 in the data storage system 220 may perform a parity scheme similar to that employed by RAID-5, RAID-6, RAID-10, or some other suitable parity scheme, as would be understood by one of skill in the art upon reading the present descriptions.

Each processor system 201 comprises one or more processors 210 (such as CPUs, microprocessors, etc.), local data storage 211 (e.g., such as RAM 814 of FIG. 8, ROM 816 of FIG. 8, etc.), and an I/O adapter 218 configured to communicate with the data storage system 220.

Referring again to FIG. 1, memory controllers 108 and/or other controllers described herein (e.g., RAID controllers 206 of FIG. 2) may be able to perform various functions on stored data, depending on the desired embodiment. Specifically, memory controllers may include logic configured to perform any one or more of the following functions, which are in no way intended to be an exclusive list. In other words, depending on the desired embodiment, logic of a storage system may be configured to perform additional or alternative functions, as would be appreciated by one skilled in the art upon reading the present description.

Garbage Collection

Garbage collection in the context of SSD memory controllers of the present description may include the process of identifying blocks of data to be reclaimed for future usage and relocating all pages that are still valid therein. Moreover, depending on the specific controller and/or the respective garbage collection unit of operation, logic erase blocks (LEBs) may be identified for being reclaimed and/or relocated. Typically, one LEB corresponds to one block stripe, but alternative implementations may consider a fixed number of block stripes building a LEB as well.

A physical "block" represents a minimal unit that may be erased on non-volatile memory, e.g., such as NAND Flash memory, and thereby prepared for writing data thereto. However, a typical garbage collection unit of operation is often a multiple of the physical blocks of non-volatile memory, and is also referred to herein as a LEB. This is due to the fact that typically RAID-like parity information is added in LEBs. Therefore, in case of a page or block failure data can only be rebuilt when all blocks in the LEB are still holding data. Accordingly, the individual blocks from the garbage collection unit can only be erased either individually or in a single unit once all still valid data from all blocks in the LEB has been relocated successfully to new locations. Hence, the full garbage collection units are garbage-collected as a single unit. Moreover, the size of the LEB directly affects the garbage collection induced write amplification. The larger the LEB, the more likely it becomes that unrelated data are stored together in the LEB, and therefore more of the LEB data may have to be relocated upon garbage collection selection.

Frequently, blocks from different dies and/or Flash channels are grouped together, such that blocks from the same group can be read or written in parallel, thereby increasing overall bandwidth. It is also possible to combine the previous two methods, and to compose RAID stripes using blocks from different Flash channels that can be accessed in parallel.

It should also be noted that an LEB may include any multiple of the physical memory block, which is a unit of physical erasure. Moreover, the organization of memory blocks into LEBs not only allows for adding RAID-like parity protection schemes among memory blocks from different memory chips, memory planes and/or channels but also allows for significantly enhancing performance through higher parallelism. For instance, multiple non-volatile memory blocks may be grouped together in a RAID stripe. As will be appreciated by one skilled in the art upon reading the present description, RAID schemes generally improve reliability and reduce the probability of data loss.

According to an exemplary embodiment, which is in no way intended to limit the invention, memory controllers (e.g., see 108 of FIG. 1) may internally perform a garbage collection. As previously mentioned, the garbage collection may include selecting a LEB to be relocated, after which all data that is still valid on the selected LEB may be relocated (e.g., moved). After the still valid data has been relocated, the LEB may be erased and thereafter, used for storing new data. The amount of data relocated from the garbage collected LEB determines the write amplification. Moreover, an efficient way to reduce the write amplification includes implementing heat segregation.

Heat Segregation

In the present context, the "write heat" of data refers to the rate (e.g., frequency) at which the data is updated (e.g., rewritten with new data). Memory blocks that are considered "hot" tend to have a frequent updated rate, while memory blocks that are considered "cold" have an update rate slower than hot blocks.

Tracking the write heat of a logical page may involve, for instance, allocating a certain number of bits in the LPT mapping entry for the page to keep track of how many write operations the page has seen in a certain time period or window. Typically, host write operations increase the write heat whereas internal relocation writes decrease the write heat. The actual increments and/or decrements to the write heat may be deterministic or probabilistic.

Similarly, read heat may be tracked with a certain number of additional bits in the LPT for each logical page. To reduce meta-data, read heat can also be tracked at a physical block level where separate counters per block for straddling and non-straddling reads can be maintained. However, it should be noted that the number of read requests to and/or read operations performed on a memory block may not come into play for heat segregation when determining the heat of the memory block for some embodiments. For example, if data is frequently read from a particular memory block, the high read frequency does not necessarily mean that memory block will also have a high update rate. Rather, a high frequency of read operations performed on a given memory block may denote an importance, value, etc. of the data stored in the memory block.

By grouping memory blocks of the same and/or similar write heat values, write heat segregation may be achieved. In particular, write heat segregating methods may group write hot memory pages together in certain memory blocks while write cold memory pages are grouped together in separate memory blocks. Thus, a write heat segregated LEB tends to be occupied by either write hot or cold data.

The merit of write heat segregation is two-fold. First, performing a garbage collection process on a write hot memory block will prevent triggering the relocation of write cold data as well. In the absence of heat segregation, updates to write hot data, which are performed frequently, also results in the undesirable relocations of all write cold data collocated on the same LEB as the hot data being relocated. Therefore, the write amplification incurred by performing garbage collection is much lower for embodiments implementing write heat segregation.

Secondly, the relative write heat of data can be utilized for wear leveling purposes. For example, write hot data may be placed in healthier (e.g., younger) memory blocks, while write cold data may be placed on less healthy (e.g., older) memory blocks relative to those healthier memory blocks. Thus, the rate at which relatively older blocks are exposed to wear is effectively slowed, thereby improving the overall endurance of a given data storage system implementing write heat segregation.

Write Allocation

Write allocation includes placing data of write operations into free locations of open LEBs. As soon as all pages in a LEB have been written, the LEB is closed and placed in a pool holding occupied LEBs. Typically, LEBs in the occupied pool become eligible for garbage collection. The number of open LEBs is normally limited and any LEB being closed may be replaced, either immediately or after some delay, with a fresh LEB that is being opened.

During performance, garbage collection may take place concurrently with user write operations. For example, as a user (e.g., a host) writes data to a device, the device controller may continuously perform garbage collection on LEBs with invalid data to make space for the new incoming data pages. As mentioned above, the LEBs having the garbage collection being performed thereon will often have some pages that are still valid at the time of the garbage collection operation; thus, these pages are preferably relocated (e.g., written) to a new LEB.

Again, the foregoing functions are in no way intended to limit the capabilities of any of the storage systems described and/or suggested herein. Rather, the aforementioned functions are presented by way of example, and depending on the desired embodiment, logic of a storage system may be configured to perform additional or alternative functions, as would be appreciated by one skilled in the art upon reading the present description.

Figure 3:
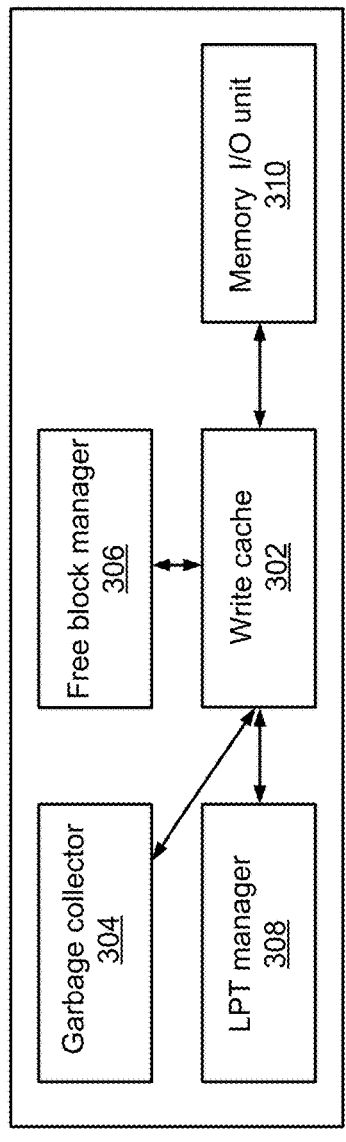
FIG. 3 is a system diagram, in accordance with one embodiment.

Referring now to FIG. 3, a system 300 is illustrated in accordance with one embodiment. As an option, the present system 300 may be implemented in conjunction with features from any other embodiment listed herein, such as those described with reference to the other FIGS. However, such system 300 and others presented herein may be used in various applications and/or in permutations which may or may not be specifically described in the illustrative embodiments listed herein. Further, the system 300 presented herein may be used in any desired environment, e.g., in combination with a controller.

As illustrated, system 300 includes a write cache 302 which is coupled to several other components, including garbage collector 304. As previously mentioned, garbage collector 304 may be used to free LEB units by relocating valid data and providing non-volatile memory blocks to be erased for later reuse. Thus, the garbage collector 304 may reclaim blocks of consecutive physical space, depending on the desired embodiment. According to an exemplary embodiment, block erase units may be used to keep track of and/or complete the erase of non-volatile memory blocks handed over by the garbage collector 304.

Write cache 302 is also coupled to free block manager 306 which may keep track of free non-volatile memory blocks after they have been erased. Moreover, as would be appreciated by one of ordinary skill in the art upon reading the present description, the free block manager 306 may build free stripes of non-volatile memory blocks from different lanes (e.g., block-stripes) using the erased free non-volatile memory blocks.

Referring still to FIG. 3, write cache 302 is coupled to LPT manager 308 and memory I/O unit 310. The LPT manager 308 maintains the logical-to-physical mappings of logical addresses to physical pages of memory. According to an example, which is in no way intended to limit the invention, the LPT manager 308 may maintain the logical-to-physical mappings of 4KiB logical addresses. The memory I/O unit 310 communicates with the memory chips in order to perform low level operations, e.g., such as reading one or more non-volatile memory pages, writing a non-volatile memory page, erasing a non-volatile memory block, etc.

Figure 4A:
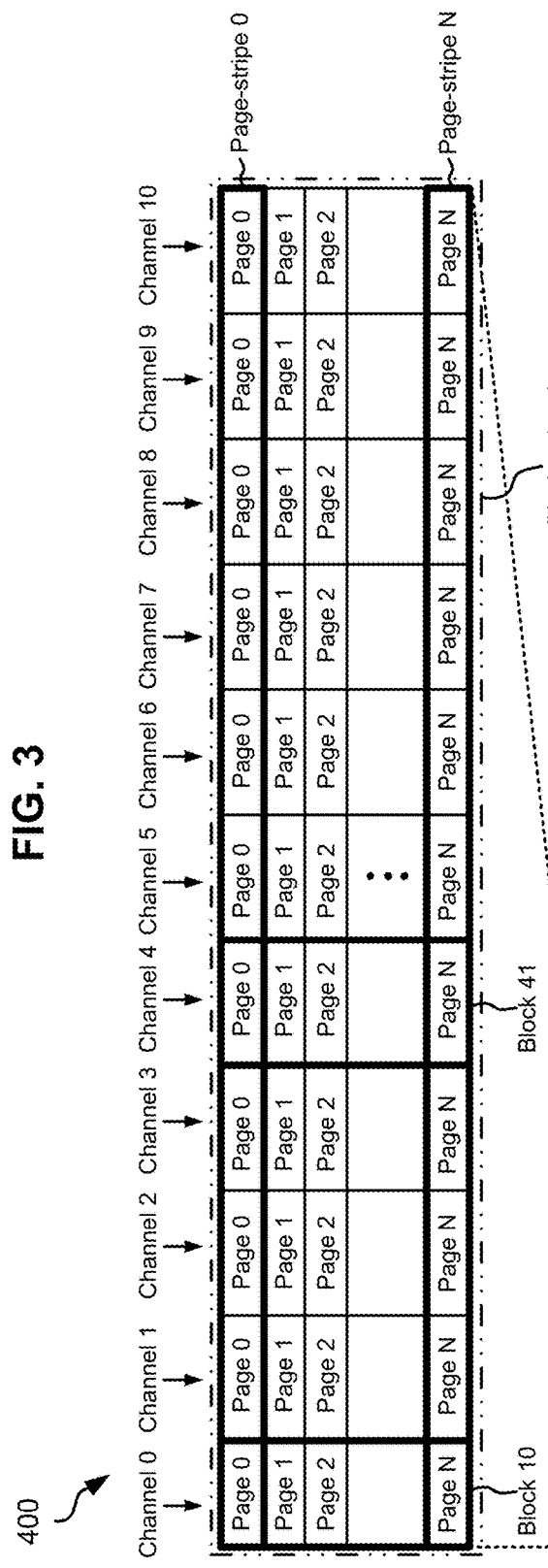
FIG. 4A is a conceptual diagram which includes a block-stripe and page-stripe, in accordance with one embodiment.

To better understand the distinction between block-stripes and page-stripes as used herein, FIG. 4A is a conceptual diagram 400, in accordance with one embodiment. LEBs are built from block stripes and typically a single block stripe is used to build a LEB. However, alternative embodiments may use multiple block stripes to form an LEB. As an option, the present conceptual diagram 400 may be implemented in conjunction with features from any other embodiment listed herein, such as those described with reference to the other FIGS. However, such conceptual diagram 400 and others presented herein may be used in various applications and/or in permutations which may or may not be specifically described in the illustrative embodiments listed herein. Further, the controller conceptual diagram 400 presented herein may be used in any desired environment. Thus, the exemplary non-volatile memory controller conceptual diagram 400 of FIG. 4A may be implemented in a cache architecture. However, depending on the desired embodiment, the conceptual diagram 400 of FIG. 4A may be implemented in defining the organization of data stored in non-volatile memory. Accordingly, both implementations are described in turn below.

Non-volatile Memory

Looking now to FIG. 4A, the conceptual diagram 400 includes a set of M+1 aggregated planes labeled "Plane 0" through "Plane M". An aggregated plane consists of all physical planes with the same plane index on different channels. It should be noted that aggregated planes are also referred to herein simply as planes.

When implemented with data stored in non-volatile memory, each physical plane on a channel may include a large set of blocks, e.g., typically in the order of 1024, 2048 or more. Moreover, one or more physical planes may also include several additional blocks which may be used as replacement blocks for bad blocks (e.g., blocks performing poorly, blocks having undesirable characteristics, etc.).

In each plane of non-volatile memory, a single block from each channel forms a respective block-stripe. It follows that a number of block-stripes supported by a given embodiment of non-volatile memory may be determined by the number of blocks per plane and the number of planes.

In the exploded view of Plane 0, the conceptual diagram 400 further illustrates a single block-stripe (Block-stripe 0) out of the set of block-stripes supported in the remainder of the planes. Block-stripe 0 of plane 0 is shown as including 11 blocks, one block from each channel labeled "Channel 0" through "Channel 10". It should be noted that the association of blocks to block-stripe can change over time as block-stripes are typically dissolved after they have been garbage collected. Erased blocks may be placed in free block pools, whereby new block-stripes are assembled from blocks in the free block pools when write allocation requests fresh block-stripes. For example, looking to conceptual diagram 400, Block 10 from Channel 0 and Block 41 from Channel 4 are currently associated with the illustrated Block-stripe 0 of Plane 0. Furthermore, the illustrated Block-stripe 0 holds N+1 page-stripes and each block therefore holds N+1 pages labeled "Page 0" through "Page N".

Cache Architecture

Referring still to FIG. 4A, each block of pages illustrated in the exploded view of aggregated Plane 0 may constitute a unique block from one channel when implemented in a cache architecture. Similarly, each channel contributes a single, individual block which form a block-stripe. For example, looking to conceptual diagram 400, Block 10 from Channel 0 includes all pages (Page 0 through Page N) therein, while Block 41 from Channel 4 corresponds to all pages therein, and so on.

In the context of a memory controller, e.g., which may be capable of implementing RAID at the channel level, a block-stripe is made up of multiple blocks which amount to a stripe of blocks. Looking still to FIG. 4A, the multiple blocks of aggregated Plane 0 constitute Block-stripe 0. While all blocks in a block-stripe typically belong to the same aggregated plane, in some embodiments one or more blocks of a block-stripe may belong to different physical planes. It follows that each aggregated plane may include one or more block-stripe. Thus, according to an illustrative embodiment, Block 0 through Block 10 from different physical planes may constitute a block-stripe.

Regardless of whether the conceptual diagram 400 of FIG. 4A is implemented with non-volatile memory and/or a cache architecture, in different embodiments, the number of pages in each block and/or the number of channels in each plane may vary depending on the desired embodiment. According to an exemplary embodiment, which is in no way intended to limit the invention, a block may include 1024 pages, but could include more or less in various embodiments. Analogously, the number of channels per plane and/or the number of planes may vary depending on the desired embodiment.

Referring still to FIG. 4A, all pages in a block-stripe with the same page index denote a page-stripe. For example, Page-stripe 0 includes the first page (Page 0) of each channel in Block-stripe 0 of Plane 0. Similarly, Page-stripe N includes the last page (Page N) of each channel in Block-stripe 0 of Plane 0.

Figure 4A:
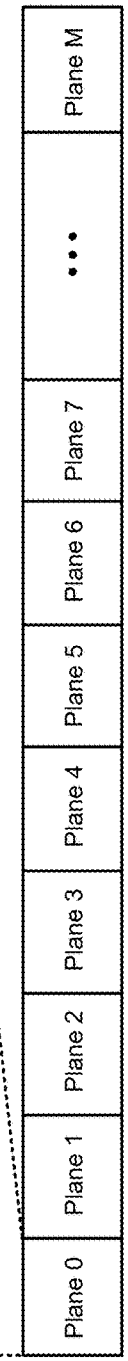
Figure 4B:
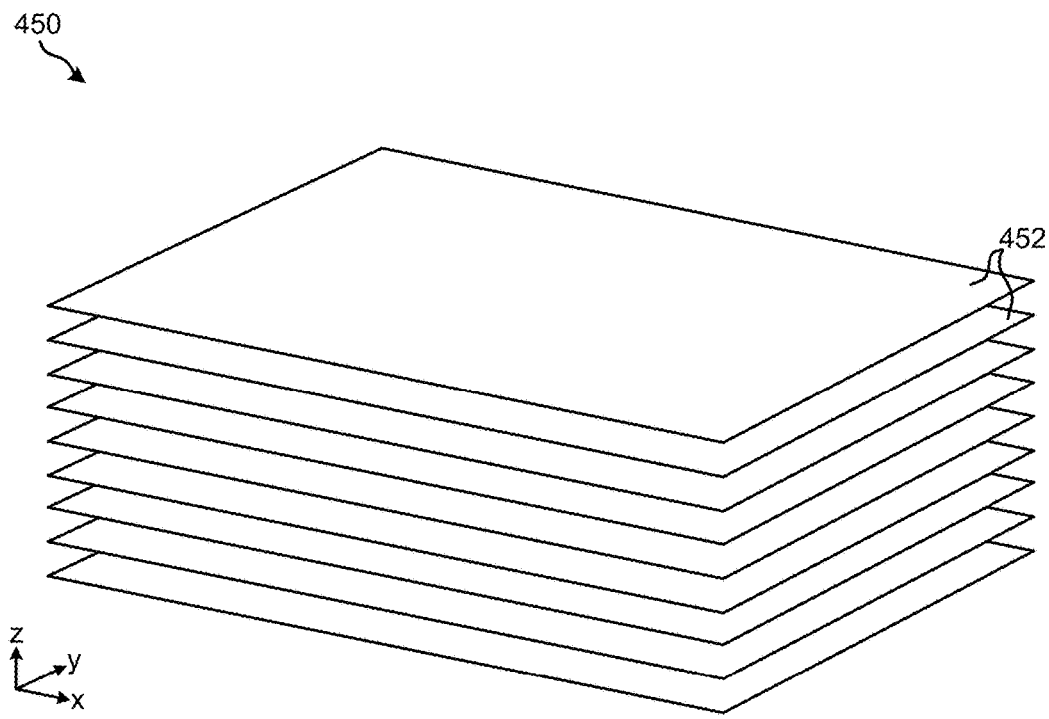
FIG. 4B is a partial perspective view of a 3-D non-volatile memory structure, in accordance with one embodiment.

The general storage architecture illustrated in the conceptual diagram 400 of FIG. 4A is also implemented by using 3-D memory structures in some approaches. For instance, FIG. 4B depicts a representational view of a 3-D non-volatile memory structure 450, in accordance with one embodiment. As an option, the present structure 450 may be implemented in conjunction with features from any other embodiment listed herein, such as those described with reference to the other FIGS., such as FIG. 4A. However, such structure 450 and others presented herein may be used in various applications and/or in permutations which may or may not be specifically described in the illustrative embodiments listed herein. Further, the structure 450 presented herein may be used in any desired environment. Thus FIG. 4B (and the other FIGS.) may be deemed to include any possible permutation.

As shown, each layer 452 of the 3-D non-volatile memory structure 450 extends along both the x-axis and the y-axis. Each of these layers 452 include a plurality of storage components (not shown), such as voltage supply lines, sensor stacks, transistors, etc., which are used to implement the non-volatile memory devices of the general storage architecture illustrated in the conceptual diagram 400 of FIG. 4A, e.g., as would be appreciated by one skilled in the art after reading the present description. Moreover, the various layers 452 are arranged in a stacked fashion along the z-axis in order to increase storage density and efficiency, e.g., by implementing shared wordlines. Cells from different bitlines along a wordline (typically in the x or y dimension of FIG. 4B) are logically combined to form pages: In TLC, each wordline in a block contains 3 physical pages (i.e., a lower page, an upper page, and an extra page) and a wordline typically belongs to one particular layer in the z dimension (perpendicular to the x-y plane). For a particular block, which is formed from a grid of cells connected by wordlines and bitlines, the number of wordlines residing on the same layer is typically small. Therefore, a block can be formed from wordlines of all layers 452. Moreover, wordlines as well as pages in the same block may reside on different layers 452.

Reading data from a single page of storage space in non-volatile memory such as NAND Flash involves applying a read voltage to the actual transistors which correspond to the page being read from. Moreover, the threshold voltage for a transistor of a given Flash memory cell is the minimum amount of voltage required to activate (e.g., turn on) the transistor. It follows that the read voltage preferably mirrors the threshold voltage for a given transistor.

When reading from more than one page on the same plane, read operations typically have to be performed one after the other. When reading from more than one page across multiple planes of a die, read operations can be performed sequentially from each plane (i.e., the read operations are performed one after the other and the addresses of the pages need not be sequential), or in parallel in some approaches. Performing read operations sequentially on pages which are included in the same plane or in different planes on the same die is relatively straightforward. Each sequential read operation performed on a page in a given plane involves issuing a read command along with an address of the page in the plane being read from. One of the things the read command specifies is a read voltage to apply when reading from the page in the given plane. It follows that a read command specifying a specific read voltage associated with that page is issued anew for each read operation and the specific read voltages can be different for each read command. As a result, performing read operations sequentially to read data from N pages introduces a total read latency "$t_{seqrd}$" represented by Equation 1 below.

$$t_{seqrd} = N \times (t_{CMD} + t_{RD} + t_{Dout}) \qquad 1$$

With respect to Equation 1, "$t_{CMD}$" represents the amount of time involved with processing and issuing a read command, "$t_{RD}$" represents the amount of time involved with actually performing the read operation to access the data from the given page in the given plane, and "$t_{Dout}$" represents the amount of time involved with actually extracting the data read from the given page. It follows that the amount of time involved with performing read operations sequentially to read data from pages has a linear relationship with the number of planes being read from.

Rather than issuing read commands sequentially, multi-plane read operations parallelize the number of Flash read operations that are issued in some approaches, thereby reducing read latency. For instance, Equation 2 represents the read latency "$t_{MPRD}$" associated with performing multi-plane read operations.

$$t_{MPRD} = t_{RD} + N \times (t_{CMD} + t_{Dout}) \qquad 2$$

As shown, the read latency is reduced significantly by parallelizing the flash read operations compared to the read latency experienced as a result of performing the read operations sequentially across multiple planes. However, the multi-plane read command is only able to specify one read voltage to apply during all of the read operations, across all planes. In other words, the same read voltage value is applied to all pages being read by a multi-plane read operation. Thus, any disparities between the threshold voltages of the pages on different planes cause the specified read voltage to be insufficient in certain situations, thereby leading to increased read errors.

Again, due to cycling, retention, read disturb, program disturb, etc., or other mechanisms that may be specific to the NAND storage technology (e.g., floating gate or charge trap), process technology (e.g., 2-D or 3-D), scaling node, etc., or other specific design factors, the programmed threshold voltage distributions in memory may change with writing and erasing data (cycling), reading data (read disturb), time (retention), etc., in a slow or fast manner. In other words, bit error rates (BERs) for Flash memory blocks increase with time and use. As memory blocks are used, each program/erase (P/E) cycle performed on the blocks causes damage, which in turn increases the corresponding BER.

Although increases to BERs are sometimes irreversible (e.g., such as those caused by prolonged program-erase cycles), increases to BERs caused by events such as retention and/or read disturbances are not permanent in the sense that the memory blocks affected are not irreversibly damaged. Rather, this unfavorable decline in performance is remedied when the corresponding memory blocks are erased and/or re-calibrated. Thus, block calibration, also known as read voltage shifting, is an important aspect of enhancing endurance and retention for storage systems, e.g., particularly enterprise-level Flash systems, by reducing the RBER experienced. This block calibration corresponds to the read voltages and refers to algorithms that are able to track the changes of the threshold voltages, thereby significantly improving the performance consistency in the respective device by reducing read tail latency which would otherwise result from error recovery mechanism invocations.

Moreover, adjustments to the read voltages are applied during a read command accordingly. It follows that the threshold voltage represents the voltage required to turn on the transistor of a given Flash memory cell and its value depends on the amount of charge stored during programming. However, the read voltage is a bias voltage, the value of which is typically between the threshold voltage of two adjacent logical states, e.g., as is explained in further detail below in FIG. 5.

Figure 5:
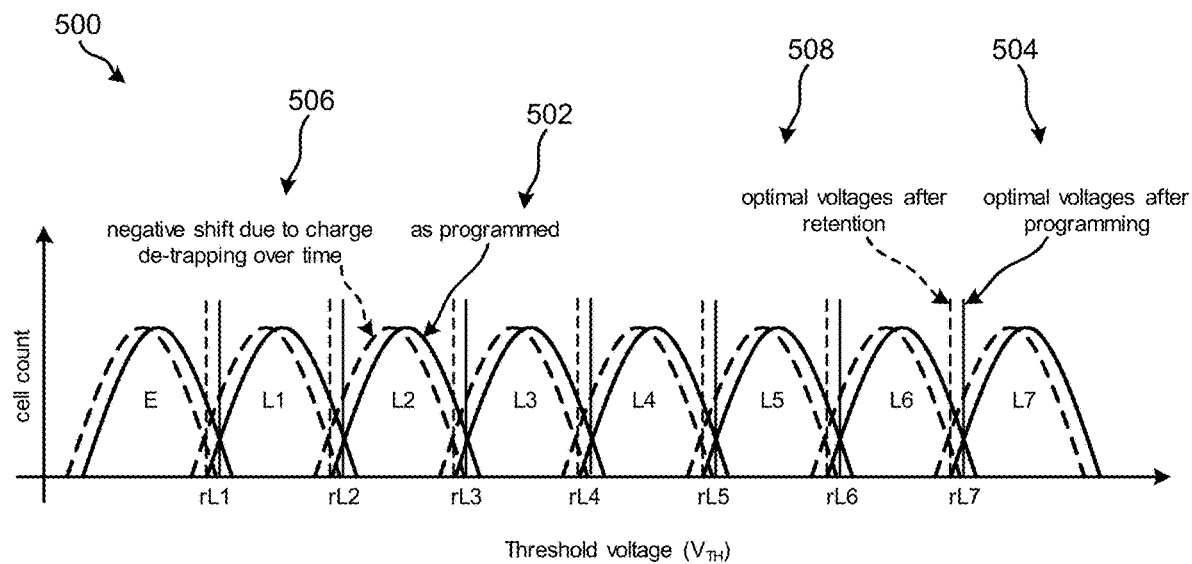
FIG. 5 is a graph which illustrates the threshold voltage shifting phenomenon, in accordance with one embodiment.

Referring momentarily to FIG. 5, a graph 500 illustrating the threshold voltage shifting phenomenon is illustrated in accordance with an example. The x-axis of the graph 500 represents the programmed threshold voltage $V_{TH}$, while the y-axis represents the corresponding cell count of a TLC NAND memory block. In TLC NAND, each memory cell stores 3 bits of information, therefore, the $V_{TH}$ distributions correspond to 8 possible discrete levels (E, L1, ..., L7). The solid distributions 502 indicate the $V_{TH}$ levels after programming. The vertical solid lines 504 indicate the read voltages (rL1, ..., rL7) that are optimal for the $V_{TH}$ distributions 502. The dashed distributions 506 indicate a negative shift of the $V_{TH}$ levels due to charge loss over time. Because of this negative shift to lower voltages, the read voltages 504 are no longer optimal. Indeed, a negative offset must be applied to the read voltages in order to account for the changes of the $V_{TH}$ distributions from 502 to 506. The vertical dashed lines 508 indicate the read voltages (rL1, ..., rL7) that are optimal during retention for the $V_{TH}$ distributions in 506. In general, each of the 8 levels (E, L1, ..., L7) shown in the figure may have a different $V_{TH}$ shifts and thus, each of the 7 read voltages (rL1, ..., rL7) may have a different optimal shift.

It follows that the programmed threshold voltage values obtained from a block calibration performed between different blocks are not dependent on each other. Hence each block maintains its own set of threshold voltage values and as a result, threshold voltage values corresponding to different blocks may vary significantly. Similarly, each page of storage space has its own preferred set of threshold voltage values. Thus, although pages in the same block with similar characteristics may be grouped together in page groups that use the same threshold voltage values, pages from different page groups (irrespective of whether they are actually from different blocks) can have significantly different threshold voltage values.

Accordingly, the read voltage shift values are preferably determined shortly after a block has been written to and/or periodically thereafter. The threshold voltage can be considered an index of the memory state, as determined by measuring the source-drain current when a control gate bias is applied to the memory cell. Typically, upon a read operation, a read voltage between adjacent nominal threshold voltages is used to determine the memory cell state. As the threshold voltage value of the memory cell changes (as explained above), the read voltage applied during a read operation is preferably shifted using a read voltage shift value to obtain optimal readout conditions and minimize BERs. Subsequently, the optimal read voltage shift values may be updated periodically, e.g., in a background health check.

As mentioned above, performing multi-plane read operations significantly reduces read latency in comparison to that experienced as a result of performing read operations sequentially across multiple planes. However, the single multi-plane read command issued is only able to specify one read voltage to apply during all of the read operations. In other words, the same read voltage value is applied to all pages being read by a multi-plane read operation.

Thus, any disparities between the threshold voltages of the pages on different planes cause the specified read voltage to be insufficient in certain situations, leading to increased read errors. It follows that read latency may be weighed against BERs depending on the particular situation in order to dynamically decide how read requests involving reading data from multiple pages should be performed, e.g., as will be described in further detail below.

Variability in page characteristics plays an important role in determining the applicability of a given read voltage. For instance, pages which belong to a same layer and which are of a same type (e.g., top pages in 3-D TLC NAND Flash, 3-D QLC NAND Flash, 2-D NAND Flash, etc.) typically have similar characteristics. However, pages which belong to different blocks typically experience block variability with respect to characterization, especially during retention. Variability in the current state of the pages also plays an important role in determining the applicability of a given read voltage. For instance, if two or more pages each have different states (e.g., such as different cycling information, retention data, read disturb history, etc.), their read-offset values will be significantly different.

This information is used in some approaches to dynamically determine whether to satisfy a multi-page read request using read operations sequentially, or using a multi-plane read operation, e.g., described herein. As a result, efficiency is significantly improved (e.g., reduces the BER) and the delay by which multi-page read operations are performed is decreased, e.g., as will be described in further detail below.

Figure 6A:
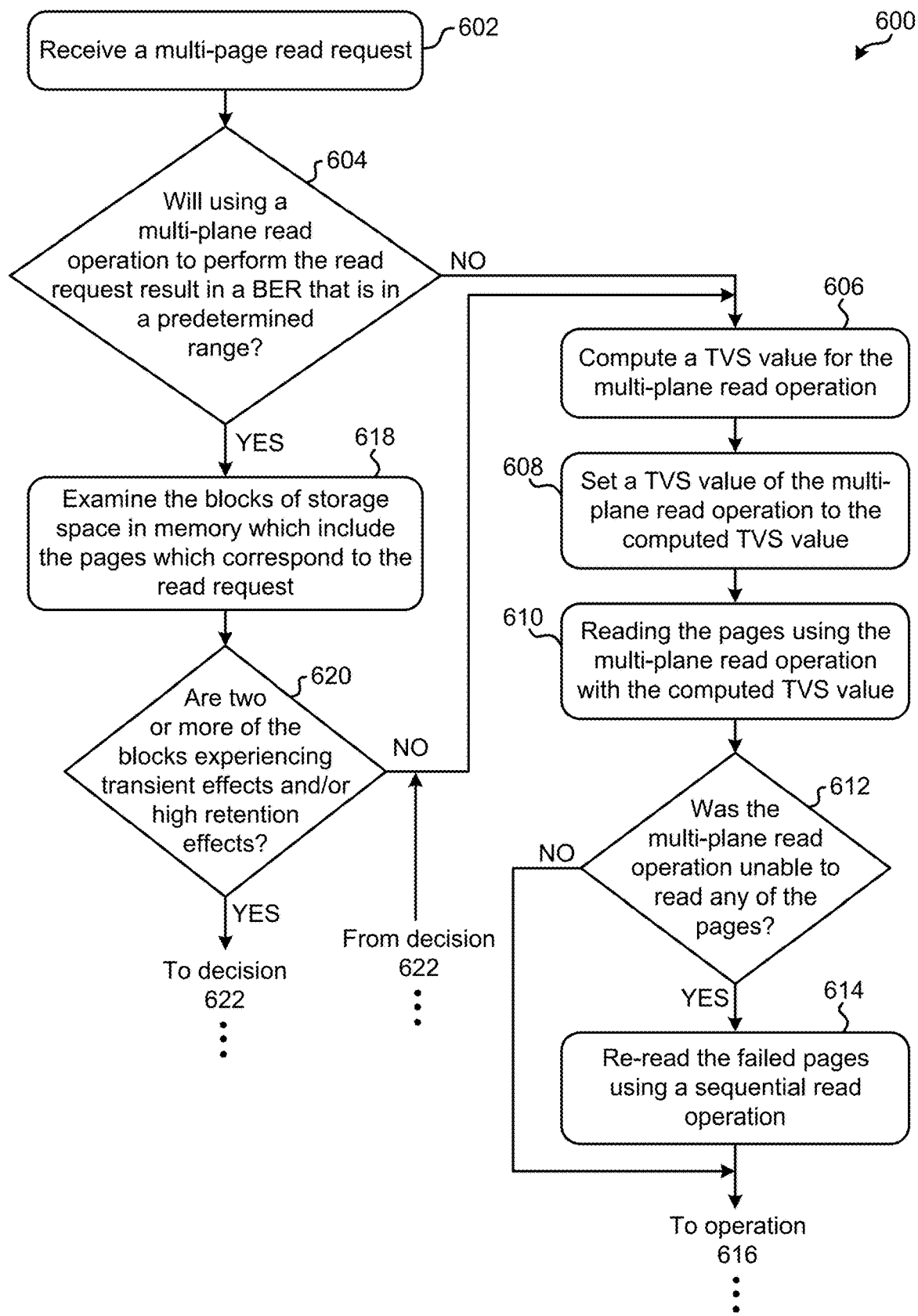
FIG. 6A is a flowchart of a method, in accordance with one embodiment.
Figure 6A:
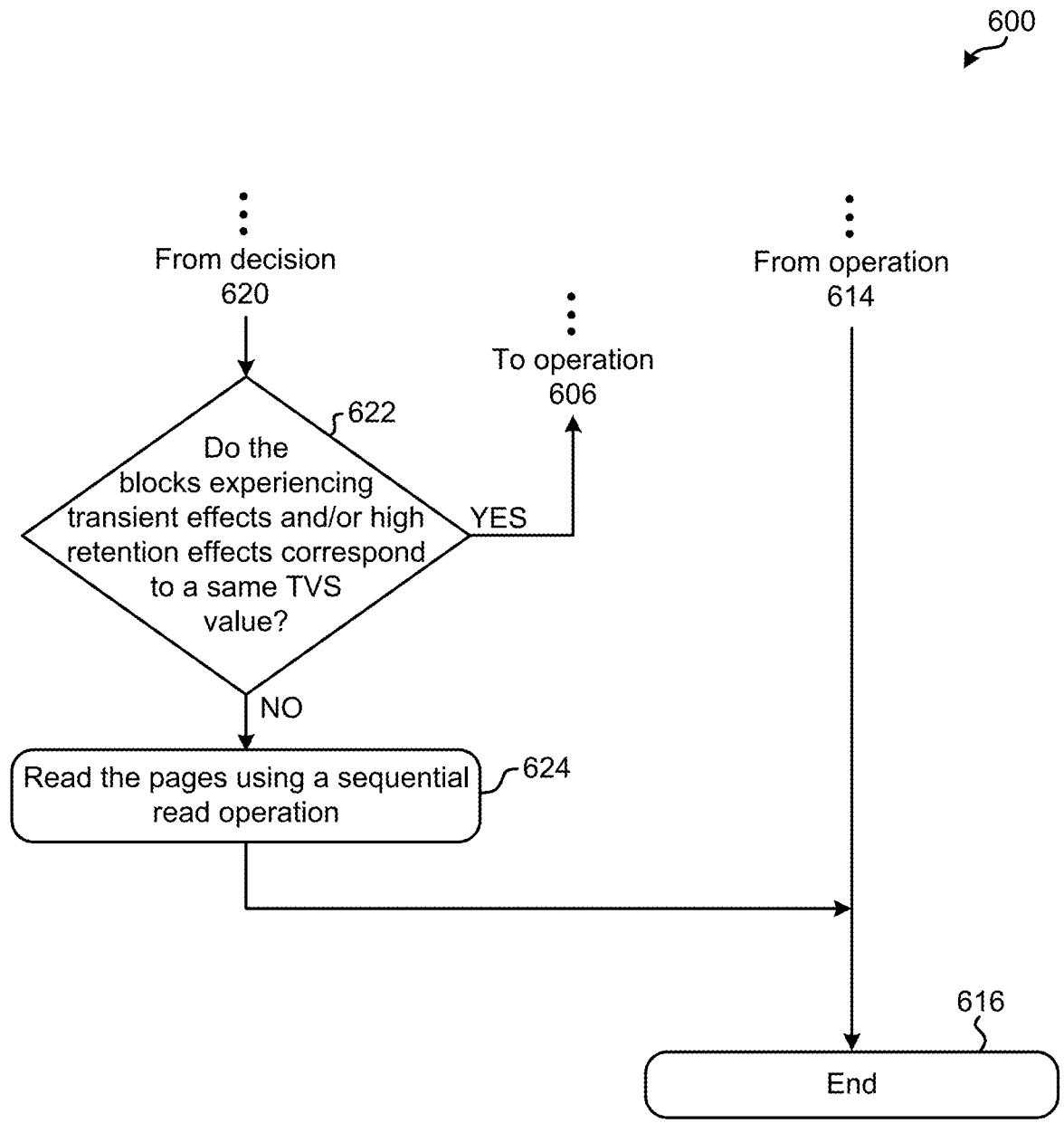

Referring now to FIG. 6A, a flowchart of a method 600 for determining how to satisfy a multi-page read operation is shown according to one embodiment. Moreover, the pages requested by said multi-page read operation reside on different planes and performing a multi-plane read on said pages is possible in the present embodiment. Otherwise, the multi-page read is performed sequentially.

The method 600 may be performed in accordance with the present invention in any of the environments depicted in FIGS. 1-5, among others, in various embodiments. For instance, any of the processes included in method 600 may be performed with respect to blocks of storage space in 3-D TLC NAND Flash, 3-D QLC NAND Flash, 2-D NAND Flash, etc., or any other desired type of memory. Furthermore, more or less operations than those specifically described in FIG. 6A may be included in method 600, as would be understood by one of skill in the art upon reading the present descriptions.

Each of the steps of the method 600 may be performed by any suitable component of the operating environment. For example, in various embodiments, the method 600 may be partially or entirely performed by a controller (e.g., Flash controller), a processor, a computer, etc., or some other device having one or more processors therein. Thus, in some embodiments, method 600 may be a computer-implemented method. It should also be noted that the terms computer, processor and controller may be used interchangeably with regards to any of the embodiments herein, such components being considered equivalents in the many various permutations of the present invention.

Moreover, for those embodiments having a processor, the processor, e.g., processing circuit(s), chip(s), and/or module (s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 6A, operation 602 of method 600 includes receiving a multi-page read request. As alluded to above, a multi-page read request is a read request which involves data stored in more than one page of storage space. These more than one pages are often times also located on more than one different plane in memory (e.g., see FIG. 4A above). Moreover, the multi-page read request may be received from a user, issued by a running application, received as a part of a data scrubbing operation running in the background, received as a part of a read-queuing system that queues and possibly coalesces incoming requests, etc., depending on the approach.

Decision 604 is performed in response to receiving the multi-page read request. As shown, decision 604 involves determining whether using a multi-plane read operation to read pages of storage space in memory which correspond to the multi-page read request will result in a BER that is in a predetermined range. Again, the same read voltage value is applied to all pages read by a multi-plane read operation. Thus, the number of read errors experienced depends on how well the read voltage which is applied corresponds to the threshold voltage of the pages being read across the planes.

The determination made in decision 604 may be based on each page location along with its corresponding page type and/or page group, e.g., as would be appreciated by one skilled in the art after reading the present description. Previous data (e.g., previously calibrated threshold voltages, past BERs, historical performance, etc.), current data (e.g., current read voltages, a running BER, user preferences, outstanding read operations, etc.), and/or projected data (e.g., anticipated threshold voltages, performance trends, etc.) may also be used in performing decision 604. It follows that decision 604 may actually involve predicting the BER which would be incurred as a result of using a multi-plane read operation to satisfy the received multi-page read request.

The BER experienced while performing a read operation has a direct effect on the read latency experienced. Thus, the predetermined range implemented in decision 604 may actually be derived using equations and/or probabilities (e.g., statistics) which approximate the amount of read latency that will be experienced as a result of implementing different types of read operations based on a number of factors. For example, Equation 3.1 below predicts the amount of read latency experienced as a result of performing a sequential read operation "$t_{SEQRD}$" to satisfy a multi-page read request, while Equation 3.2 and Equation 3.2' are used to predict the amount of read latency experienced as a result of performing a multi-plane read operation "$t_{MPRD}$" to satisfy a multi-page read request. Moreover, Equation 3.3 below predicts a combined amount of read latency experienced as a result of performing a multi-plane read operation in addition to a sequential read operation "$t_{TOTRD}$" in order to satisfy a multi-page read request. These equations can therefore be utilized in order to predict an amount of read latency would be experienced as a result of satisfying an arbitrary multi-page read operation using only a sequential read operation, compared to using only a multi-plane read operation, further compared to using both a multi-plane read operation and a sequential read operation. Thus, the amount of read latency and/or BER value predicted for each type of read operation (or combination thereof) is preferably used to make the determination performed in decision 604, e.g., as would be appreciated by one skilled in the art after reading the present description.

$$t_{SEQRD} = \sum_{i}^{N}(t_{CMD} + t_{RD} + t_{Dout} + prob_{eccfail}(TVS_i, p_i, b_i) * t_{RDRTR}) \quad \text{Equation 3.1}$$

$$t_{MPRD} = t_{RD} + \sum_{i}^{N}(t_{CMD} + t_{Dout} + prob_{eccfail}(TVS_f, p_i, b_i) * t_{SEQRD}(\text{failed pages})) \quad \text{Equation 3.2}$$

$$TVS_f = f(pg_i, b_{bi}, \ldots, b_{bN}, TVS_i, \ldots, TVS_{i+N}) \quad \text{Equation 3.2'}$$

$$t_{TOTRD}(N, \{p_i, \ldots, p_N\}, \{b_{bi}, \ldots, b_{bN}\}, \quad \text{Equation 3.2'}$$
$$\{TVS_i, \ldots, TVS_{i+N}\}) = \begin{cases} t_{SEQRD} \\ t_{MPRD} \end{cases}$$

As mentioned above, "$t_{CMD}$" represents the amount of time involved with processing and issuing a read command, "$t_{RD}$" represents the amount of time involved with actually performing the Flash read operation to access the data from the given page in the given plane, and "$t_{Dout}$" represents the amount of time involved with actually extracting the data read from the given plane. Moreover, "$prob_{eccfail}$" represents the probability of experiencing a read error which is uncorrectable for each TVS value "$TVS_i$", in each plane "$p_i$", and in each block "$b_i$" from "i" to "N", where "N" represents the total number of page read operations, where each page is included in a different plane. Furthermore, "$t_{RDRTR}$" represents the amount of time involved with performing a read-retry operation (a failsafe command that will try to minimize the read operation's BER), while "$t_{SEQRD}$" represents the amount of time involved with performing a re-read operation for each of the failed pages sequentially. The variable "$TVS_f$" represents the TVS value which is applied to each of the page groups in a multi-plane read operation (e.g., as will be described in further detail below), which is shown in Equation 3.2' as being a function of the TVS values "$TVS_i$" determined for each of the page groups "$pg_i$", and blocks "$b_{bi}$" between "i" and "N".

According to an in-use example, which is in no way intended to limit the invention, non-volatile memory types such as 3-D TLC NAND, QLC NAND, high Flash chip bus connection (e.g., greater than 200 MHz), etc., $t_{RD} \gg t_{Dout}$. For example, $t_{RD}$ may be about 88 μs, and $t_{Dout}$ may be about 12 μs. Furthermore, $prob_{eccfail}$ is typically much less than 1 (e.g., 10e-6), $t_{CMD}$ is typically much less than $t_{Dout}$, and $t_{RD}$ is typically much less than $t_{RDRTR}$ (e.g. $t_{RDRTR}$ may be about 1 ms).

Referring still to decision 604, the range may be predetermined based on user preferences and/or inputs, industry standards, past performance, etc., in combination with, or alternatively to, applying Equation 3.1, Equation 3.2, Equation 3.2' and/or Equation 3.3, e.g., depending on the approach. It follows that "in a predetermined range" is in no way intended to limit the invention. Rather than determining whether a value is in a predetermined range, equivalent determinations may be made, e.g., as to whether a value is above a threshold, whether a value is outside a predetermined range, whether an absolute value is above a threshold, whether a value is below a threshold, etc., depending on the desired approach. It follows that the determination made in decision 604 depends, at least in part, on the page type, page group, block, plane, etc. that the data being read is stored in.

In response to determining that using a multi-plane read operation to read pages of storage space in memory which correspond to the multi-page read request will not result in a BER that is in a predetermined range, method 600 proceeds to operation 606. There, operation 606 includes computing a threshold voltage shift (TVS) value for the multi-plane read operation. The TVS value is applied to the read voltage value to change the actual voltage which is applied to perform the read operations. In other words, the TVS value is used to adjust the read voltage value to best match the actual threshold voltages of the pages being read, e.g., as would be appreciated by one skilled in the art after reading the present description.

Figure 6B:
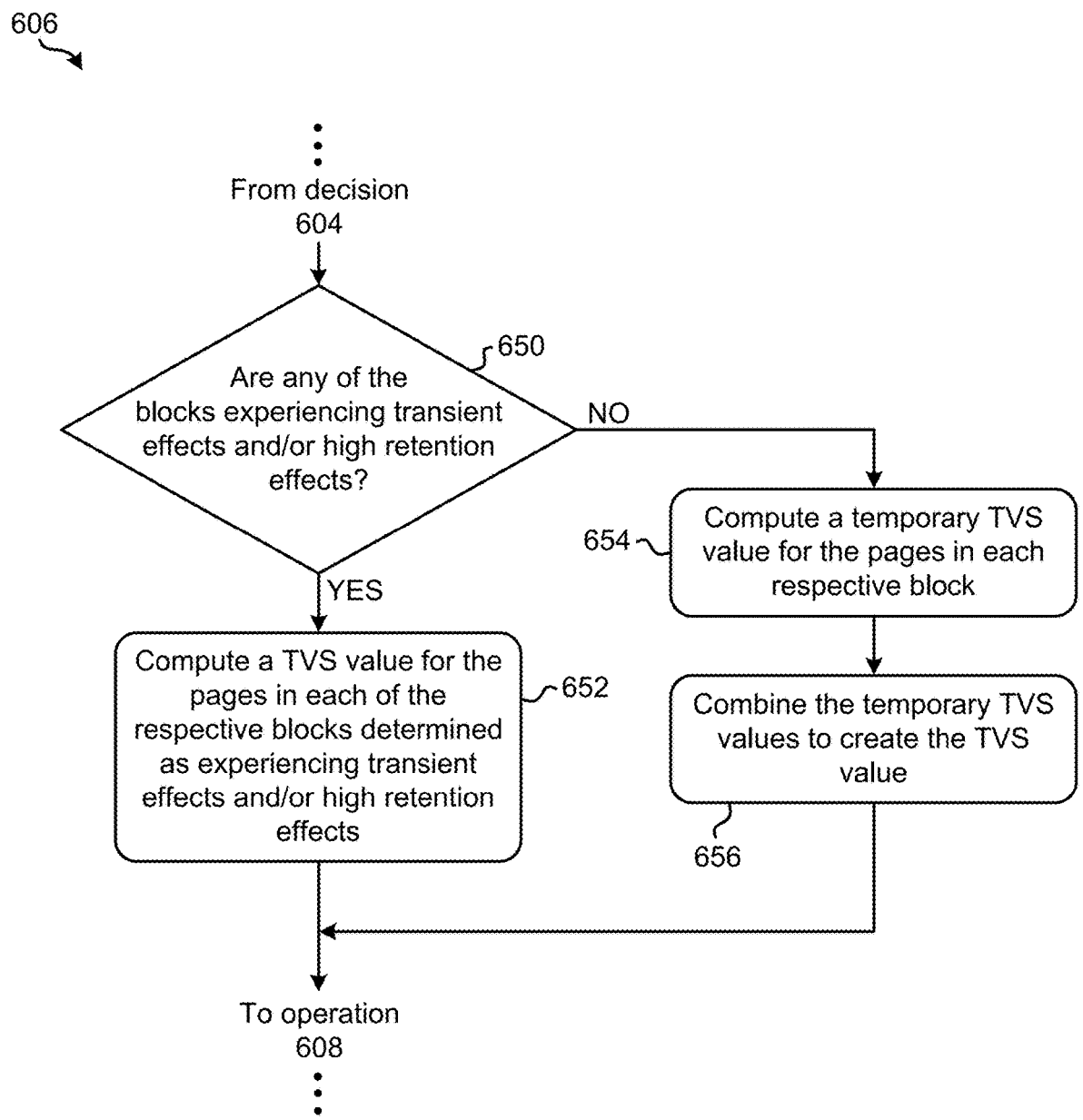
FIG. 6B is a flowchart of sub-processes for one of the operations in the method of FIG. 6A, in accordance with one embodiment.

Referring momentarily to FIG. 6B, exemplary sub-processes of computing a TVS value for a multi-plane read operation are illustrated in accordance with one embodiment, one or more of which may be used to perform operation 606 of FIG. 6A. However, it should be noted that the sub-processes of FIG. 6B are illustrated in accordance with one embodiment which is in no way intended to limit the invention.

As shown, decision 650 includes determining whether any blocks of storage space in the memory which include the pages that correspond to the multi-page read request, for which one or more pages in said multi-page read operation were already predicted in decision 604 and that are expected to be in a predefined BER range, are experiencing transient effects and/or high retention effects. In other words, decision 650 includes determining whether any of the pages which store the data specified in the multi-page read request are included in a block that is experiencing transient effects and/or high retention effects. With respect to the present description, "transient effects" and "high retention effects" are intended to refer to effects which drastically alter the threshold voltage of the physical components which correspond to the given portion of memory. For instance, the transistors which correspond to blocks of storage space experience transient changes to the threshold voltage thereof, causing preprogrammed read voltages to become inaccurate, which in turn increases BERs experienced. In other approaches, events such as retention and/or read disturbances also have negative effects on the performance of blocks of storage space and even lead to high retention. Accordingly, in some approaches the determination made in decision 650 involves examining the worst BERs of the page groups within the blocks in which the pages corresponding to the multi-page read request are located.

The flowchart proceeds to sub-operation 652 in response to determining that at least one block is experiencing transient effects and/or high retention effects. There, sub-operation 652 includes computing the TVS value for a subset of the pages in the block(s) determined as experiencing transient effects and/or high retention effects. In many approaches, only one of the blocks evaluated in performing decision 650 are determined as experiencing transient effects and/or high retention effects. As such, sub-operation 652 often includes computing the TVS value for a subset of the pages which are included in a single block.

Yet, it should be noted that in situations involving more than one block determined as experiencing transient effects and/or high retention effects, one or more of the sub-processes included in FIG. 6B may be performed differently. For instance, in approaches where the blocks have the same TVS value for a given page group, decision 622 may be performed differently. In such approaches, the block determined as experiencing the most critical transient effects and/or high retention effects is used to compute the TVS value thereof. Alternatively, a block determined as experiencing a most recent transient effect and/or high retention effect is used to compute the TVS value thereof. In still other approaches, more than one of the blocks are used to compute the TVS value. It should also be noted that the TVS value(s) may be computed using any processes which would be apparent to one skilled in the art after reading the present description, e.g., depending on the desired approach.

From sub-operation 652, the flowchart returns to method 600 of FIG. 6A, and proceeds to operation 608 as show. However, returning to decision 650, the flowchart advances to sub-operation 654 in response to determining that none of the blocks are experiencing transient effects and/or high retention effects. There, sub-operation 654 includes computing a temporary TVS value for a subset of the pages in each respective block. In other words, sub-operation 654 includes computing a "partial" TVS value for each of the blocks which include the pages that correspond to the multi-page read request. These temporary (or partial) TVS values are also combined to create the TVS value. See sub-operation 656.

Any one or more of the temporary TVS values may be computed using any of the approaches described above with respect to sub-operation 652. According to an illustrative approach, which is in no way intended to limit the invention, a TVS value (e.g., TVS value and/or temporary TVS value) for a given block of storage space is computed by calibrating one or more of the pages in the given block. This is performed in some approaches by applying a sweeping range of read voltages to the transducers which correspond to the pages of storage space in order to determine the respective threshold voltages thereof. These threshold voltages may also be aggregated in order to form the TVS value for the overall block.

The process of combining the temporary TVS values also varies depending on the desired approach. For instance, in some approaches an averaging function is used to calculate an average value of the temporary TVS values, i.e., the TVS value is an average of the temporary TVS values. Yet in other approaches, the TVS value may be a median, a mode, etc., of the temporary TVS values.

From sub-operation 656, the flowchart also returns to method 600 of FIG. 6A, and proceeds to operation 608 as show. Operation 608 includes setting a TVS value of the multi-plane read operation to the computed TVS value. In other words, operation 608 includes actually applying the TVS value computed in operation 606 to the multi-plane operation. Moreover, operation 610 further includes actually reading the pages using the multi-plane read operation with (e.g., using) the TVS value computed above. It should be noted that the "multi-plane operation" is intended to refer to a procedure which involves performing a multi-plane read procedure. In some approaches, the multi-plane read procedure is able to read data from different planes in parallel, and even simultaneously in parallel. Again, the read commands are issued at the same time for all pages being read from, thereby reducing the amount of delay otherwise experienced as a result of receiving an individual read command for each plane being read from in a sequential fashion.

Moving to decision 612, a determination is made as to whether the multi-plane read operation was unable to read at least one of the pages. Although the TVS value implemented by the multi-plane read operation was computed based on the actual condition of the pages and/or blocks of storage space, one or more read errors may occur for a variety of reasons. For instance, the TVS value implemented by the multi-plane read operation is an average, median, mode, etc. of the temporary TVS values in some approaches, and therefore may result in a read voltage which is lower than the threshold voltage of one or more transducers being accessed, preventing the transducer from being activated.

In response to determining that the multi-plane read operation was unable to read at least one of the pages, (e.g., such as a read operation which resulted in UBER by the ECC), which correspond to the multi-page read request, method 600 proceeds to operation 614. There, operation 614 includes re-reading the at least one of the pages that failed to be read, using a sequential read operation. As mentioned above, more than one TVS value may be applied while reading from different pages, blocks, planes, etc. using a sequential read operation. Although more time consuming, sequential read operations are not able to target more than one block of storage space at a time. A sequential read operation is thereby able to calibrate a TVS value for each page and/or block and implement it while attempting to read data therefrom. Sequential read operations are less likely to experience read errors resulting from application of an incorrect (e.g., inaccurate) TVS value to a given portion of memory, and even fall back to a failsafe read retry (or re-read) operation that will exhaustively try to find a TVS value that does not result in UBER.

From operation 614, the flowchart of FIG. 6A proceeds to operation 616, whereby method 600 may end. Similarly, method 600 jumps to operation 616 from decision 612 in response to determining that the multi-plane read operation was able to read all of the pages. However, it should be noted that although method 600 may end upon reaching operation 616, any one or more of the processes included in method 600 may be repeated in order to perform additional multi-page read requests. In other words, any one or more of the processes included in method 600 may be repeated for satisfying subsequently received multi-page read requests.

Returning now to decision 604, method 600 advances to operation 618 in response to determining (e.g., predicting) that using the multi-plane read operation to read the pages will result in a BER that is in a predetermined range, per page. There, operation 618 includes examining the blocks of storage space in the memory which include the pages which correspond to the multi-page read request. Examining the blocks of storage space may be accomplished differently depending on the approach. For instance, in some approaches examining the blocks includes evaluating previous performance characteristics of the blocks. In other approaches, examining the blocks includes actually calibrating each of the blocks.

Information gathered by examining the blocks in operation 618, or any other information, is preferably used to perform decision 620, which includes determining whether two or more of the blocks are experiencing transient effects and/or high retention effects. In other words, decision 620 includes determining whether any two or more of the pages which store the data specified in the multi-page read request are included in a block that are experiencing transient effects and/or high retention effects. As mentioned above, "transient effects" and "high retention effects" are intended to refer to effects which dramatically alter the threshold voltage of the physical components which correspond to the given portion of memory. For instance, the transistors which correspond to blocks of storage space experience transient changes to the threshold voltage thereof, which in turn increases BERs experienced. In other approaches, events such as retention and/or read disturbances also have negative effects on the performance of blocks of storage space and even lead to high RBER. Accordingly, performing decision 620 may implement any one or more of the approaches described above, e.g., with respect to decision 650 in FIG. 6B.

In response to determining that fewer than two of the blocks (i.e., one or none of the blocks) are experiencing transient effects and/or high retention effects, method 600 proceeds to operation 606. There, operation 606 includes computing the TVS value as described above. However, method 600 proceeds to decision 622 in response to determining that two or more of the blocks are experiencing transient effects and/or high retention effects. As shown, decision 622 includes determining whether the two or more of the blocks experiencing transient effects and/or high retention effects correspond to a same TVS value. In other words, decision 622 includes determining whether the two or more blocks determined as experiencing transient effects and/or high retention effects each have a threshold voltage substantially similar to each other. This determination is performed in some approaches, because despite experiencing transient effects and/or high retention effects, two or more blocks which have similar threshold voltages may be successfully read using a TVS value which adjusts the read voltage applied to match the common threshold voltage. This TVS value can thereby be applied to a multi-plane read operation used to read the requested data.

Accordingly, method 600 proceeds from decision 622 to operation 606 in response to determining that the two or more blocks determined as experiencing transient effects and/or high retention effects each have a threshold voltage substantially similar to each other. However, the flowchart alternatively proceeds from decision 622 to operation 624 in response to determining that the two or more blocks determined as experiencing transient effects and/or high retention effects each have a threshold voltage which is not substantially similar to each other. There, operation 624 includes reading the pages sequentially, one after the other. Performing operation 624 may involve applying any one or more of the approaches described above, e.g., with respect to operation 614. However, any sequential read operations and/or processes thereof which would be apparent to one skilled in the art after reading the present description may be applied, e.g., depending on the desired approach.

From operation 624, the flowchart of method 600 proceeds to operation 616, whereby method 600 may end. It should again be noted that although method 600 may end upon reaching operation 616, any one or more of the processes included in method 600 may be repeated in order to perform additional multi-page read requests. In other words, any one or more of the processes included in method 600 may be repeated for satisfying subsequently received multi-page read requests.

It follows that various ones of the embodiments herein are able to significantly improve the efficiency by which multi-page read operations are performed in non-volatile memory, e.g., such as NAND Flash. This improvement to operational efficiency is accomplished as a result of the read latency reductions, decreases in achievable BERs, increases in computational throughput of computing-based systems, etc., directly and/or indirectly caused by various ones of the approaches included herein. For instance, in response to receiving a multi-page read request, a number of parameters including, but in no way limited to, the page types, page groups, block characteristics, etc. are evaluated in order to dynamically determine how to satisfy the multi-page read request in a most efficient manner.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Figure 7:
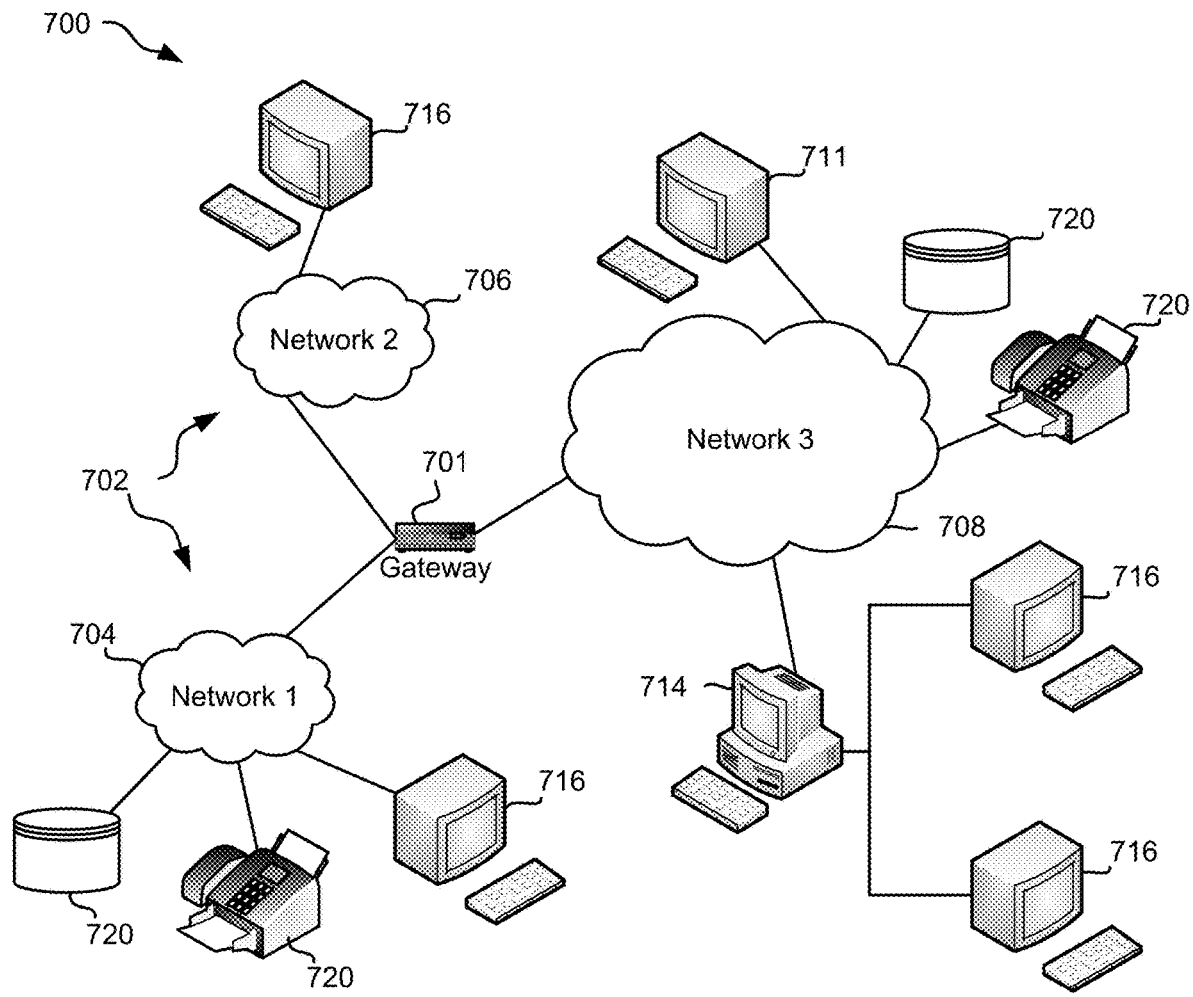
FIG. 7 is a network architecture, in accordance with one embodiment.

FIG. 7 illustrates a network architecture 700, in accordance with one embodiment. As shown in FIG. 7, a plurality of remote networks 702 are provided including a first remote network 704 and a second remote network 706. A gateway 701 may be coupled between the remote networks 702 and a proximate network 708. In the context of the present network architecture 700, the networks 704, 706 may each take any form including, but not limited to a LAN, a WAN such as the Internet, public switched telephone network (PSTN), internal telephone network, etc.

In use, the gateway 701 serves as an entrance point from the remote networks 702 to the proximate network 708. As such, the gateway 701 may function as a router, which is capable of directing a given packet of data that arrives at the gateway 701, and a switch, which furnishes the actual path in and out of the gateway 701 for a given packet.

Further included is at least one data server 714 coupled to the proximate network 708, and which is accessible from the remote networks 702 via the gateway 701. It should be noted that the data server(s) 714 may include any type of computing device/groupware. Coupled to each data server 714 is a plurality of user devices 716. Such user devices 716 may include a desktop computer, laptop computer, handheld computer, printer, and/or any other type of logic-containing device. It should be noted that a user device 711 may also be directly coupled to any of the networks, in some embodiments.

A peripheral 720 or series of peripherals 720, e.g., facsimile machines, printers, scanners, hard disk drives, networked and/or local data storage units or systems, etc., may be coupled to one or more of the networks 704, 706, 708. It should be noted that databases and/or additional components may be utilized with, or integrated into, any type of network element coupled to the networks 704, 706, 708. In the context of the present description, a network element may refer to any component of a network.

According to some embodiments, methods and systems described herein may be implemented with and/or on virtual systems and/or systems which emulate one or more other systems, such as a UNIX system which virtually hosts a MICROSOFT WINDOWS environment, etc. This virtualization and/or emulation may be enhanced through the use of VMWARE software, in some embodiments.

In other embodiments, one or more networks 704, 706, 708, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 8:
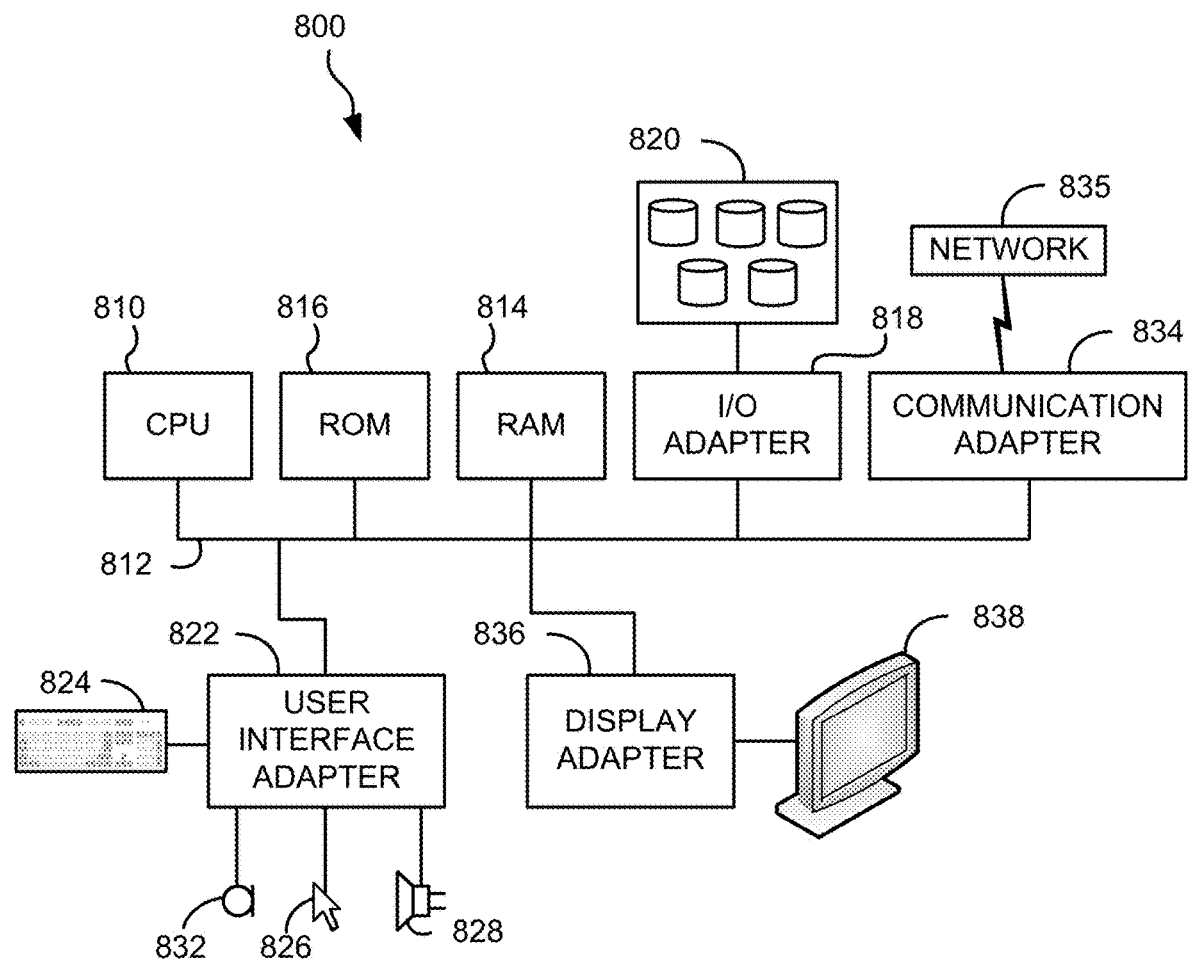
FIG. 8 is a representative hardware environment that may be associated with the servers and/or clients of FIG. 7, in accordance with one embodiment.

FIG. 8 shows a representative hardware environment associated with a user device 716 and/or server 714 of FIG. 7, in accordance with one embodiment. FIG. 8 illustrates a typical hardware configuration of a processor system 800 having a central processing unit 810, such as a microprocessor, and a number of other units interconnected via a system bus 812, according to one embodiment. In some embodiments, central processing unit 810 may include any of the approaches described above with reference to the one or more processors 210 of FIG. 2.

The processor system 800 shown in FIG. 8 includes a RAM 814, ROM 816, and an I/O adapter 818. According to some embodiments, which are in no way intended to limit the invention, I/O adapter 818 may include any of the approaches described above with reference to I/O adapter 218 of FIG. 2. Referring still to processor system 800 of FIG. 8, the aforementioned components 814, 816, 818 may be used for connecting peripheral devices such as storage subsystem 820 to the bus 812. In some embodiments, storage subsystem 820 may include a similar and/or the same configuration as data storage system 220 of FIG. 2. According to an example, which is in no way intended to limit the invention, storage subsystem 820 may include non-volatile data storage cards, e.g., having NVRAM memory cards, RAM, ROM, and/or some other known type of non-volatile memory, in addition to RAID controllers as illustrated in FIG. 2.

With continued reference to FIG. 8, a user interface adapter 822 for connecting a keyboard 824, a mouse 826, a speaker 828, a microphone 832, and/or other user interface devices such as a touch screen, a digital camera (not shown), etc., to the bus 812.

Processor system 800 further includes a communication adapter 834 which connects the processor system 800 to a communication network 835 (e.g., a data processing network) and a display adapter 836 which connects the bus 812 to a display device 838.

The processor system 800 may have resident thereon an operating system such as the MICROSOFT WINDOWS Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

Figure 9:
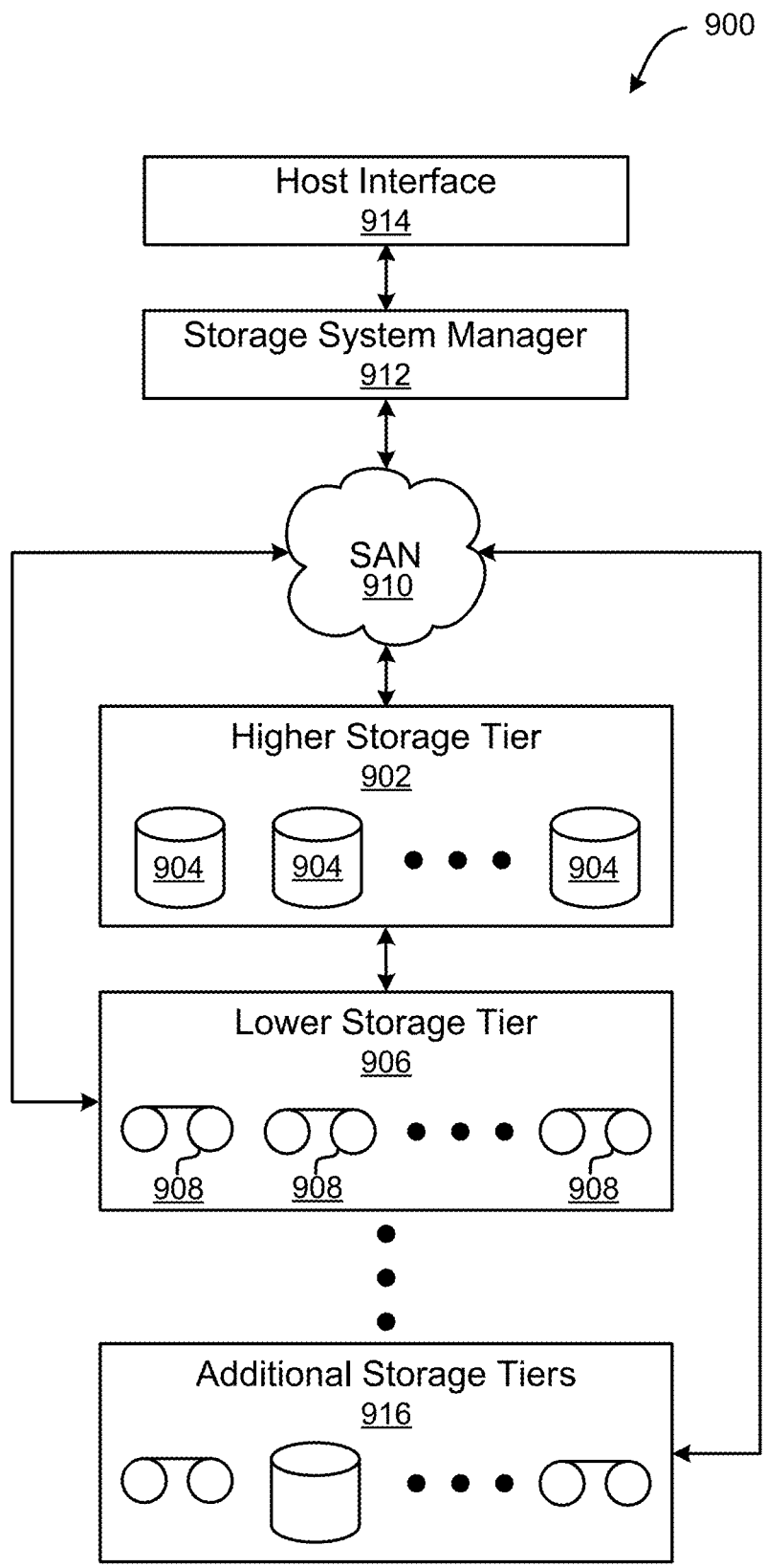
FIG. 9 is a tiered data storage system in accordance with one embodiment.

Moreover, FIG. 9 illustrates a storage system 900 which implements high level (e.g., SSD) storage tiers in combination with lower level (e.g., magnetic tape) storage tiers, according to one embodiment. Note that some of the elements shown in FIG. 9 may be implemented as hardware and/or software, according to various embodiments. The storage system 900 may include a storage system manager 912 for communicating with a plurality of media on at least one higher storage tier 902 and at least one lower storage tier 906. However, in other approaches, a storage system manager 912 may communicate with a plurality of media on at least one higher storage tier 902, but no lower storage tier. The higher storage tier(s) 902 preferably may include one or more random access and/or direct access media 904, such as hard disks, nonvolatile memory (NVM), NVRAM), solid state memory in SSDs, Flash memory, SSD arrays, Flash memory arrays, etc., and/or others noted herein or known in the art. According to illustrative examples, FIGS. 3-4 show exemplary architectures of SSD systems which may be used as a higher storage tier 902 depending on the desired embodiment.

Referring still to FIG. 9, the lower storage tier(s) 906 preferably includes one or more lower performing storage media 908, including sequential access media such as magnetic tape in tape drives and/or optical media, slower accessing HDDs, slower accessing SSDs, etc., and/or others noted herein or known in the art. One or more additional storage tiers 916 may include any combination of storage memory media as desired by a designer of the system 900. Thus, the one or more additional storage tiers 916 may, in some approaches, include a SSD system architecture similar or the same as those illustrated in FIGS. 1-2. Also, any of the higher storage tiers 902 and/or the lower storage tiers 906 may include any combination of storage devices and/or storage media.

The storage system manager 912 may communicate with the storage media 904, 908 on the higher storage tier(s) 902 and lower storage tier(s) 906 through a network 910, such as a storage area network (SAN), as shown in FIG. 9, or some other suitable network type. The storage system manager 912 may also communicate with one or more host systems (not shown) through a host interface 914, which may or may not be a part of the storage system manager 912. The storage system manager 912 and/or any other component of the storage system 900 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 900 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 902, may include a majority of SSD storage media for storing data in a higher performing storage environment, and remaining storage tiers, including lower storage tier 906 and additional storage tiers 916 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 902, while data not having one of these attributes may be stored to the additional storage tiers 916, including lower storage tier 906. Of course, one of skill in the art, upon reading the present descriptions, may devise many other combinations of storage media types to implement into different storage schemes, according to the embodiments presented herein.

According to some embodiments, the storage system (such as 900) may include logic configured to receive a request to open a data set, logic configured to determine if the requested data set is stored to a lower storage tier 906 of a tiered data storage system 900 in multiple associated portions, logic configured to move each associated portion of the requested data set to a higher storage tier 902 of the tiered data storage system 900, and logic configured to assemble the requested data set on the higher storage tier 902 of the tiered data storage system 900 from the associated portions.

Of course, this logic may be implemented as a method on any device and/or system or as a computer program product, according to various embodiments.

What is claimed is:

1. A computer-implemented method, comprising:
receiving a multi-page read request;
predicting whether using a multi-plane read operation to read pages of storage space in memory which correspond to the multi-page read request will result in a bit error rate that is in a predetermined range;
in response to predicting that using the multi-plane read operation to read the pages will not result in a bit error rate that is in the predetermined range, computing a threshold voltage shift (TVS) value for the multi-plane read operation; and
reading the pages using the multi-plane read operation with the computed TVS,
wherein computing the TVS value includes:
determining whether any blocks of storage space in the memory which include the pages are experiencing transient effects, retention effects, or transient effects and retention effects,
in response to determining that a block is experiencing transient effects, retention effects, or transient effects and retention effects, computing the TVS value for a subset of the pages in the block experiencing transient effects, retention effects, or transient effects and retention effects,
in response to determining that none of the blocks are experiencing transient effects, retention effects, or transient effects and retention effects, computing a temporary TVS value for a subset of the pages in each respective block, and
combining the temporary TVS values to create the TVS value.

2. The computer-implemented method of claim 1, comprising:
determining whether the multi-plane read operation was unable to read at least one of the pages; and
in response to determining that the multi-plane read operation was unable to read at least one of the pages, re-reading the at least one of the pages using a sequential read operation.

3. The computer-implemented method of claim 1, comprising:
in response to predicting that using the multi-plane read operation to read the pages will result in a bit error rate that is in a predetermined range, examining blocks of storage space in the memory which include the pages;
determining whether two or more of the blocks are experiencing transient effects, retention effects, or transient effects and retention effects; and in response to determining that fewer than two of the blocks are experiencing transient effects, retention effects, or transient effects and retention effects, computing the TVS value.

4. The computer-implemented method of claim 3, comprising:
in response to determining that two or more of the blocks are experiencing transient effects, retention effects, or transient effects and retention effects, reading the pages using a sequential read operation.

5. The computer-implemented method of claim 1, wherein the TVS value is an average of the temporary TVS values.

6. The computer-implemented method of claim 1, wherein the TVS value is a median of the temporary TVS values.

7. The computer-implemented method of claim 1, wherein the memory includes three-dimensional triple-level cell NAND Flash.

8. A computer program product comprising a computer readable storage medium having program instructions embodied therewith, the program instructions readable, executable, or readable and executable by a processor to cause the processor to:
receive, by the processor, a multi-page read request;
predict, by the processor, whether using a multi-plane read operation to read pages of storage space in memory which correspond to the multi-page read request will result in a bit error rate that is in a predetermined range;
in response to predicting that using the multi-plane read operation to read the pages will not result in a bit error rate that is in the predetermined range, compute, by the processor, a threshold voltage shift (TVS) value for the multi-plane read operation; and
read, by the processor, the pages using the multi-plane read operation with the computed TVS,
wherein computing the TVS value includes:
determining whether any blocks of storage space in the memory which include the pages are experiencing transient effects, retention effects, or transient effects and retention effects;
in response to determining that a block is experiencing transient effects, retention effects, or transient effects and retention effects, computing the TVS value for a subset of the pages in the block experiencing transient effects, retention effects, or transient effects and retention effects;
in response to determining that none of the blocks are experiencing transient effects, retention effects, or transient effects and retention effects, compute, by the processor, a temporary TVS value for a subset of the pages in each respective block; and
combine, by the processor, the temporary TVS values to create the TVS value.

9. The computer program product of claim 8, the program instructions readable, executable, or readable and executable by the processor to cause the processor to:
determine, by the processor, whether the multi-plane read operation was unable to read at least one of the pages; and
in response to determining that the multi-plane read operation was unable to read at least one of the pages, re-read, by the processor, the at least one of the pages using a sequential read operation.

10. The computer program product of claim 8, the program instructions readable executable, or readable and executable by the processor to cause the processor to:
in response to predicting that using the multi-plane read operation to read the pages will result in a bit error rate that is in a predetermined range, examine, by the processor, blocks of storage space in the memory which include the pages;
determine, by the processor, whether two or more of the blocks are experiencing transient effects, retention effects, or transient effects and retention effects; and
in response to determining that fewer than two of the blocks are experiencing transient effects, retention effects, or transient effects and retention effects, compute, by the processor, the TVS value.

11. The computer program product of claim 10, the program instructions readable, or executable, or readable and executable by the processor to cause the processor to:
in response to determining that two or more of the blocks are experiencing transient effects, retention effects, or transient effects and retention effects, read, by the processor, the pages using a sequential read operation.

12. The computer program product of claim 8, wherein the TVS value is an average of the temporary TVS values.

13. The computer program product of claim 8, wherein the TVS value is a median of the temporary TVS values.

14. A system, comprising:
a processor; and
logic integrated with, executable by, or integrated with and executable by the processor, the logic being configured to:
receive, by the processor, a multi-page read request;
predict, by the processor, whether using a multi-plane read operation to read pages of storage space in memory which correspond to the multi-page read request will result in a bit error rate that is in a predetermined range;
in response to predicting that using the multi-plane read operation to read the pages will not result in a bit error rate that is in the predetermined range, compute, by the processor, a threshold voltage shift (TVS) value for the multi-plane read operation; and
read, by the processor, the pages using the multi-plane read operation with the computed TVS,
wherein computing the TVS value includes:
determining whether any blocks of storage space in the memory which include the pages are experiencing transient effects, retention effects, or transient effects and retention effects,
in response to determining that a block is experiencing transient effects, retention effects, or transient effects and retention effects, computing the TVS value for a subset of the pages in the block experiencing transient effects, retention effects, or transient effects and retention effects,
in response to determining that none of the blocks are experiencing transient effects, retention effects, or transient effects and retention effects, computing a temporary TVS value for a subset of the pages in each respective block, and
combining the temporary TVS values to create the TVS value.

15. The system of claim 14, wherein the memory includes three-dimensional triple-level cell NAND Flash.

* * * * *